United States Patent
Chang et al.

(10) Patent No.: US 7,496,862 B2
(45) Date of Patent: Feb. 24, 2009

(54) METHOD FOR AUTOMATICALLY MODIFYING INTEGRATED CIRCUIT LAYOUT

(75) Inventors: Mi-Chang Chang, Hsinchu (TW); Su-Ya Lin, Alian Township, Kaohsiung County (TW); Jen-Hang Yang, Yonghe (TW); Li-Chun Tien, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 219 days.

(21) Appl. No.: 11/512,823

(22) Filed: Aug. 29, 2006

(65) Prior Publication Data
US 2008/0059916 A1 Mar. 6, 2008

(51) Int. Cl.
*G06F 17/50* (2006.01)
(52) U.S. Cl. .............................. 716/1; 716/11
(58) Field of Classification Search ...................... 716/1, 716/11
See application file for complete search history.

(56) References Cited

U.S. PATENT DOCUMENTS 5,625,568 A * 4/1997 Edwards et al. ............... 716/2
2007/0113216 A1* 5/2007 Zhang .......................... 716/17

* cited by examiner

*Primary Examiner*—Stacy A Whitmore
*Assistant Examiner*—Magid Y Dimyan
(74) *Attorney, Agent, or Firm*—K & L Gates LLP

(57) ABSTRACT

This invention discloses a method for automatically adjusting cell layout height and transistor width of one type of MOS IC cells, the method comprising following steps of Boolean logic operations on at least one such cell: identifying one or more MOS transistor active areas (ODs) and one or more power ODs in an OD layer, expanding the MOS transistor ODs in a predetermined direction by a first predetermined amount, shifting the power ODs in the predetermined direction by a second predetermined amount, expanding one or more MOS transistor gate areas in the predetermined direction by a third predetermined amount, shifting one or more power OD contacts in the predetermined direction by approximately the second predetermined amount, and stretching one or more metal areas (M1s) in a metal layer that is directly coupled to the OD layer through contacts electronically, in the predetermined direction by a predetermined way.

6 Claims, 7 Drawing Sheets

250 ─╮

| Grow NWell upward  710 |

| Grow PRBNDRY both upward and downward  810 |

```
Grow PP upper edge upward for PMOS P+  910
            │
            ▼
Shift PP for Vss power OD to new location  920
```

```
Shift NP for Vdd power OD to new location  1010
            │
            ▼
Grow NP lower edge downward for NMOS N+  1020
```

FIG. 10

METHOD FOR AUTOMATICALLY MODIFYING INTEGRATED CIRCUIT LAYOUT

BACKGROUND

The present invention relates generally to electronic design automation for integrated circuit (IC) designs, and, more particularly, to a method for automatically modifying IC layout.

IC layout is the representation of an integrated circuit in terms of planar geometric shapes that correspond to shapes actually drawn on photo-masks used in semiconductor device fabrication. IC layout may be created by automatic EDA tools, such as place and route tools or schematic driven layout tools, or created and edited by an IC designer manually by means of IC layout editors.

Complex IC chip designs are often based on libraries of many standard cells, provided by foundries or special intellectual property (IP) vendors. Layout of the individual standard cells is often handcrafted. But a standard cell provider may face many different requirements from different customers. Some require high-density, others may require high speed. Different customers may require different cell heights to fit in their specific layout structure. Besides, processes even within the same generation may slightly vary for different applications, which may create different device models and require different channel width ratios between a P-type metal-oxide-semiconductor (PMOS) and a N-type metal-oxide-semiconductor (NMOS), or P/N ratios, for short.

The traditional way of meeting different requirements by a standard cell vendor is to manually modify each standard cell layout. But given a large number of standard cells, plus numerous targets by various customers. Manual modification is very costly and time consuming.

Another way of meeting different requirements by a standard cell vendor is to use a commercial migration tool. However, commercial migration tools are more generic and mainly targeted at migration from one process generation to another. They are very complicated to operate, and require many computing hours. If every standard cell has to run through the migration tool for every different customer requirements, then any time or manpower saving from the migration tool will diminish. These generic migration tools will alter layout architecture, and enlarge cell areas that should all be avoided.

As such, what is needed is a method for automatically modifying the IC layout to meet specific requirements, such as cell heights and P/N ratio, within a process generation.

SUMMARY

There is a need for the following embodiments. Of course, the invention is not limited to these embodiments.

According to a first aspect of the invention, a method for automatically adjusting the layout cell height and transistor width of one type of MOS IC cells comprises following the steps of Boolean logic operations on at least one such cell: identifying one or more MOS transistor active areas (ODs) and one or more power ODs in an OD layer, expanding the MOS transistor ODs in a predetermined direction by a first predetermined amount, shifting the power ODs in the predetermined direction by a second predetermined amount, expanding one or more MOS transistor gate areas in the predetermined direction by a third predetermined amount, shifting one or more power OD contacts in the predetermined direction by approximately the second predetermined amount, and stretching one or more metal areas (M1s) in a metal layer that is directly coupled to the OD layer through contacts electronically, in the predetermined direction by a predetermined way.

According to a second aspect of the invention, a method for automatically adjusting the layout of a complimentary-metal-oxide-semiconductor (CMOS) integrated circuit (IC) cells comprises the following steps of Boolean logic operations on at least one such cell: identifying one or more PMOS transistor active areas (ODs) and PMOS gate areas, identifying one or more NMOS transistor active areas (ODs) and NMOS gate areas, identifying one or more high voltage power ODs, identifying one or more low voltage power ODs, identifying one or more PMOS metal areas (M1s) that are directly coupled to the high voltage power ODs through contacts electronically in a metal layer, identifying one or more NMOD M1s that are directly coupled to the low voltage ODs through contacts electronically in the metal layer, expanding the PMOS transistor ODs and the PMOS gate areas in a first predetermined direction by a first predetermined amount, shifting the high voltage power ODs and affiliated contacts therein in the first predetermined direction by a second predetermined amount, stretching the PMOS M1s in the first predetermined direction by a first predetermined way, expanding the NMOS transistor ODs and the NMOS gate areas in a second predetermined direction opposite to the first predetermined direction by a third predetermined amount, shifting the low voltage power ODs and affiliated contacts therein in the second predetermined direction by a fourth predetermined amount, and stretching the NMOS M1s in the second predetermined direction by a second predetermined way.

The construction and method of operation of the invention, however, together with additional objectives and advantages thereof will be best understood from the following description of the specific embodiments when read in connection with the accompanying drawings.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore non-limiting, embodiments illustrated in the drawings, wherein like reference numbers (if they occur in more than one view) designate the same elements. The invention may be better understood by reference to one or more of these drawings in combination with the description presented herein. It should be noted that the features illustrated in the drawings are not necessarily drawn to scale.

FIG. 7 details layout adjustment on the Nwell (NW) layer.

FIG. 8 details layout adjustment on the boundary (PRBNDRY) layer.

FIG. 9 is a flow chart illustrating detailed layout adjustment on the P+ implant (PP) layer.

FIG. 10 is a flow chart illustrating a detailed layout adjustment on N+ implant (NP) layer.

DESCRIPTION

Figure 1:
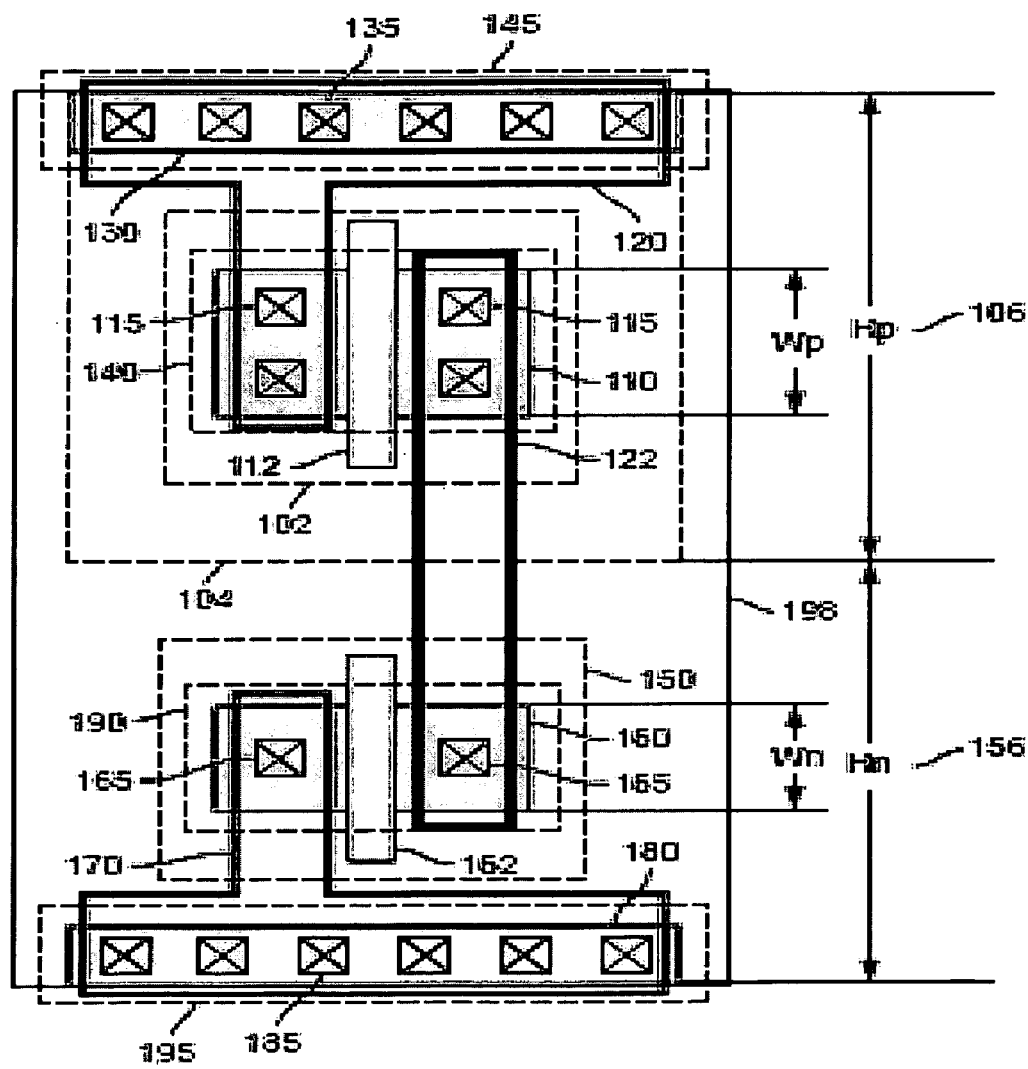
FIG. 1 is a layout diagram illustrating an exemplary section of a complementary metal-semiconductor-oxide (CMOS) integrated circuit (IC) layout.

The present invention provides a method for automatically adjusting such layout features as cell height and device channel width, etc., in integrated circuit (IC) standard library cells, as different customers may have different requirements for cell height and/or device channel widths within a same technology node.

While the invention is susceptible of embodiment in many different forms, there is shown in the drawings and will herein be described in detail, several specific embodiments, with the understanding that the present disclosure is to be considered as an exemplification of the principles of the invention and is not intended to limit the invention to the embodiments illustrated.

FIG. 1 is a layout diagram illustrating an exemplary section of a complementary metal-semiconductor-oxide (CMOS) integrated circuit (IC) layout. The CMOS IC comprises certain basic layers according to a particular layout style. These basic layers include an active layer (OD) for defining active areas of the CMOS devices, a POLY layer for defining gate areas of the CMOS devices, a contact layer (CO) for defining contacts to the OD or POLY areas from a metal1 (M1) layer, a Nwell implant layer (NW) for defining P-type metal-semiconductor-oxide (PMOS) areas if a Psubstrate is used (then N-type metal-semiconductor-oxide (NMOS) areas are anywhere outside the NW), a P+ implant layer (PP) for defining source/drain regions of the PMOS transistor, and a N+ implant layer (NP) for defining source/drain regions of the NMOS transistor. There are other layers, such as the transistor threshold adjustment implant layers (VT) and other metal layers (M2, . . . ), but when adjusting such layout features as cell height and device channel widths, these other layers and their adjustment methods either follow the basic layers (for VT) or no change at all (for M2), and their discussions are omitted here.

Referring to FIG. 1, a PMOS transistor 102 is placed in an NW region 104 within the height of Hp, which represents the cell height of a PMOS region 106. The PMOS transistor 102 comprises an OD region 110, a POLY area 112 as a gate, COs 115 on both sides of the POLY 110 as source/drain pick-ups (M1 contacts to OD). A channel width of the PMOS transistor 102 is Wp as shown in FIG. 1. A M1 120 is connected to the source of the PMOS transistor 102, while another M1 122 is connected to the drain of the PMOS transistor 102. OD 130 forms a bulk pickup as well as a guide ring for the PMOS transistor 102. The M1 120 is also connected to the guide ring OD 130 through COs 135. Since the M1 120 is for the PMOS transistor 102, it is connected to a positive high supply voltage (Vdd). OD 130 is also generally called power OD, and more specifically called Vdd OD.

Referring to FIG. 1, similarly, a NMOS transistor 150 is placed in a height of Hn, which represents the cell height of a NMOS region 156. The NMOS transistor 150 has OD region 160, a POLY gate area 162, and source/drain pickup COs 165. A channel width of the NMOS transistor 150 is Wn as shown in FIG. 1. A M1 170 is connected to the source of the NMOS transistor 150, while the M1 122 is connected to the drain of the NMOS transistor 150. OD 180 forms a bulk pickup as well as a guide ring for the NMOS transistor 150. The M1 170 is also connected to the guide ring OD 180 through COs 185. Since the M1 170 is for the NMOS transistor 150, it is connected to a complementary low supply voltage (Vss). OD 180 is also generally called power OD, and more specifically called Vss OD.

Referring to FIG. 1, PP implant 140 covers PMOS OD 110 to make source/drain P+ of the PMOS transistor 102. NP implant 145 covers Vdd OD 130. Another NP implant 190 covers NMOS OD 160 to make source/drain N+ of the NMOS transistor 150. Another PP implant 195 covers Vss OD 180. A transitional layer (PRBNDRY) 198 covering entire OD area is a boundary layer for assisting logic operations during layout adjustment.

Referring to FIG. 1, both the PMOS transistor 102 and the NMOS transistor 150 are placed in a vertical orientation, which is represented by vertically placed gates. One key aspect of the present invention is that all the transistors in a particular library cell shares an identical placement orientation, i.e., they are all placed either vertically or horizontally, so that all the transistors can receive the same adjustment by a certain adjustment operation. In a broader sense, one key concept that forms the bases for the methods of the present invention relies on the fact that the layout style (placement orientations, etc.) are uniformed throughout an entire library, and they are known to the designers who devise automatic layout adjustment scripts based on the layout style.

Figure 2:
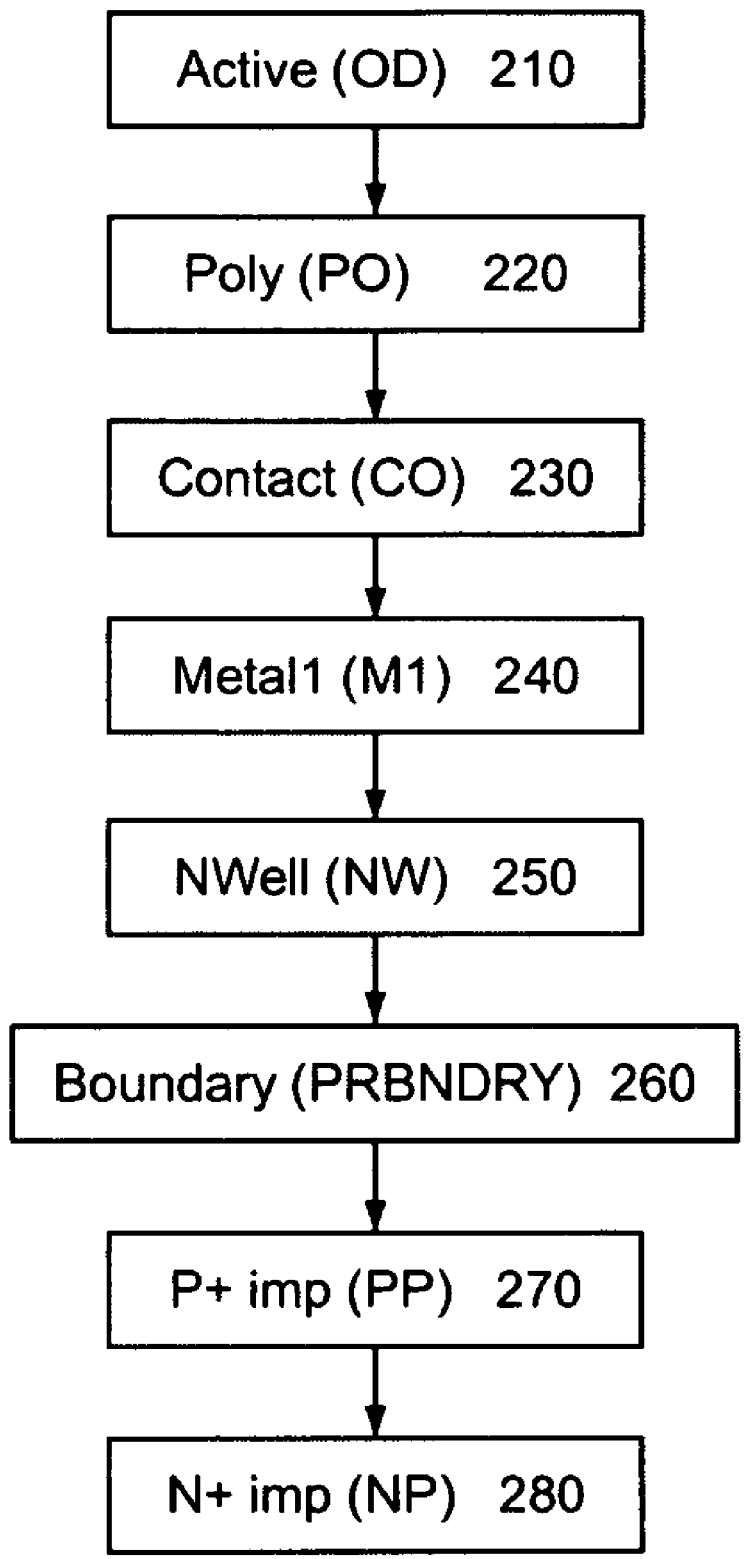
FIG. 2 is a flow chart illustrating layout adjustment steps for adjusting cell height and expanding transistor channel width according to one embodiment of the present invention.

FIG. 2 is a flow chart illustrating layout adjustment steps for adjusting cell height and expanding transistor channel widths according to one embodiment of the present invention. Since PMOS and NMOS transistor channel widths can be separately adjusted, then the channel width ratio between the PMOS and NMOS transistors (P/N ratio) is adjustable according to the embodiment of the present invention. Although any particular sequence of the layout adjustment steps is not required, the active layer (OD) adjustment in step 210 is customarily the first step, followed by the poly layer (PO) adjustment in step 220, the contact layer (CO) adjustment in step 230, the metal1 layer (M1) adjustment in step 240, the NWell layer (NW) adjustment in step 250, the boundary layer (PRBNDRY) adjustment in step 260, the P+ implant layer (PP) adjustment in step 270 and N+ implant layer (NP) adjustment in step 280. Other layers, such as vial and metal2, etc., need not be adjusted, as adjusting cell height and/or expand transistor channel width will not affect functions or correctness of these layers.

The following paragraphs are devoted to describe software scripts for implementing each individual layer's layout adjustment, which incorporates both cell height and device channel width adjustments. Nevertheless, the cell and device channel width adjustments are independent of each other. If only one adjustment is needed, then the portion of the scripts for implementing the other adjustment can be disabled without affecting the needed adjustment. The software scripts are written in a Standard Verification Rule Format (SVRF), and can be run on a commercial layout verification tool, such as Calibre from Mentor Graphics Corporation according to the embodiment of the present invention. Note that any words following a double slash sign, "//", in the same line, are comments on that line of scripts, and hence are not executable.

Following are definitions of some of the variables used in the scripts.

| | |
|---|---|
| VARIABLE RSL | // resolution |
| VARIABLE PUOD_IMPENC_V | // PP/NP enclose pick-up OD |
| VARIABLE PMOS_WIDTH | // the smallest PMOS width to be adjusted |
| VARIABLE NMOS_WIDTH | // the smallest NMOS width to be adjusted |
| VARIABLE ADD_PMOS_WIDTH | // increased PMOS width |
| VARIABLE ADD_NMOS_WIDTH | // increased NMOS width |
| VARIABLE POWER_WIDTH | // original power width |
| VARIABLE NEW_POWER_WIDTH | // new power width |
| VARIABLE PO_W_1 | //POLY width |
| VARIABLE PO_EX_2 | //OD extension on POLY |

The above layout areas increased amounts are uniformly set according to cell height and/transistor channel width adjustment requirement, but these amounts can be arbitrarily set to other numbers without affecting Boolean logic operating principles and often times, not even layout adjustment results.

Figure 3:
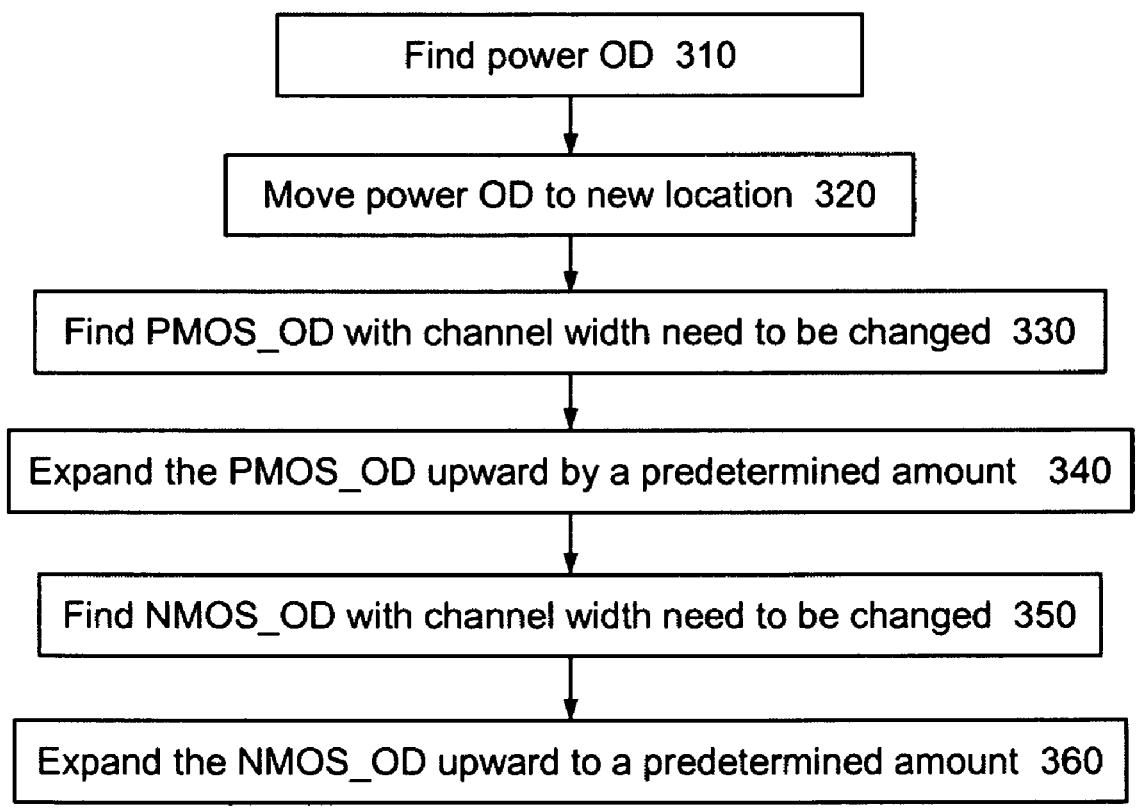
FIG. 3 is a flow chart illustrating layout adjustment steps for the active (OD) layer.

FIG. 3 is a flow chart illustrating layout adjustment steps for the OD layer, or step 210 shown in FIG. 2. Step 310 is to find power OD 120 and 185 as shown in FIG. 1, and scripts for step 310 are:

```
GATE = PO AND OD // Gate regions for NMOS and PMOS
POWER_IMP = (NP INSIDE NW) OR (PP NOT INSIDE NW) // find POWER_IMPLANT
POWER_OD = OD AND POWER_IMP // find POWER_OD
NO_POWER_OD = OD NOT POWER_OD // find other OD
(not include POWER_OD)
```

Once the power ODs are identified, they are shifted to new locations to satisfy new cell height requirements in step 320, and scripts for this step are:

```
VDD_OD_TEMP1 = POWER_OD AND NW // find VDD_OD
FINAL_VDD_OD = SHIFT VDD_OD_TEMP1 BY 0 ADD_PMOS_WIDTH // shift VDD_OD to a predetermined location
VSS_OD_TEMP1 = POWER_OD NOT NW // find VSS_OD
FINAL_VSS_OD = SHIFT VSS_OD_TEMP1 BY 0 (-ADD_NMOS_WIDTH) // shift VSS_OD to desired Location
FINAL_POWER_OD = FINAL_VDD_OD OR FINAL_VSS_OD // new POWER_OD
```

Step, 330 is to find all the PMOS transistors with channel widths that need to be changed, and scripts for step 330 are:

```
WIDE_PMOS_OD_TEMP1 = PMOS_OD INTERACT GATE
WIDE_PMOS_OD_TEMP2 = SHRINK WIDE_PMOS_OD_TEMP1 TOP BY (PMOS_WIDTH-0.002)/2 BOTTOM BY (PMOS_WIDTH-0.002)/2 // any PMOS_OD width narrower than the predetermined value, PMOS_Width, will disappear;
WIDE_PMOS_OD = (GROW WIDE_PMOS_OD_TEMP2 TOP BY (PMOS_WIDTH-0.002)/2 BOTTOM BY (PMOS_WIDTH-0.002)/2) INTERACT GATE // grow back the remaining PMOS_OD, which are targeted PMOS transistors that need to change width.
```

Step 340 is to expand the PMOS transistor OD top edge upward by a predetermined amount to achieve desired width adjustment, and a script for step 340 is simply:

```
FINAL_PMOS_OD = GROW WIDE_PMOS_OD TOP BY ADD_PMOS_WIDTH // expand the upper edge of PMOS_OD upward by a predetermined amount
```

Similarly, step 350 is for finding NMOS transistors with channel widths that need to be changed, and scripts for step 350 are:

```
WIDE_NMOS_OD_TEMP1 = NMOS_OD INTERACT GATE
WIDE_NMOS_OD_TEMP2 = SHRINK WIDE_NMOS_OD_TEMP1 TOP BY (NMOS_WIDTH-0.002)/2 BOTTOM BY (NMOS_WIDTH-0.002)/2 // any NMOS_OD width narrower than the predetermined value, NMOS_Width, will disappear
WIDE_NMOS_OD = (GROW WIDE_NMOS_OD_TEMP4 TOP BY (NMOS_WIDTH-0.002)/2 BOTTOM BY (NMOS_WIDTH-0.002)/2) INTERACT GATE // grow back the remaining NMOS_OD, which are targeted NMOS transistors that need to change width
```

Step 360 is to expand the NMOS transistor OD bottom edge downward by a predetermined amount to achieve desired width adjustment, and a script for step 360 is simply:

```
FINAL_NMOS_OD = GROW WIDE_NMOS_OD BOTTOM BY
ADD_NMOS_WIDTH   // expand the NMOS_OD downward to a
desired width
```

Figure 4:
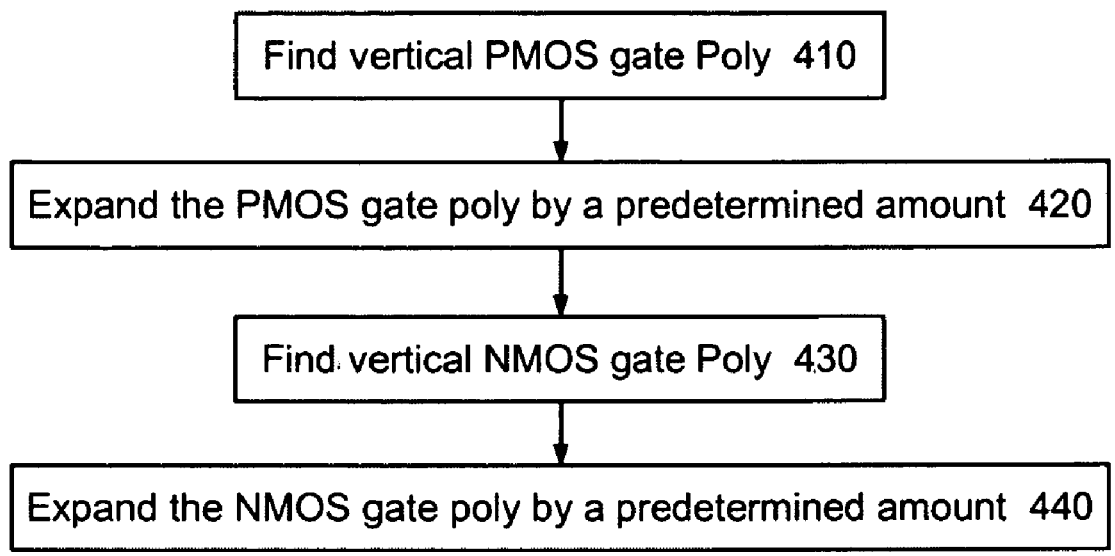
FIG. 4 is a flow chart illustrating layout adjustment steps for the poly (PO) layer.

FIG. 4 is a flow chart illustrating layout adjustment steps for the poly (PO) layer, or step 220 shown in FIG. 2. Step 410 is to find vertical PMOS gate poly 112 as shown in FIG. 1, and scripts for step 410 are:

```
PMOS_POLY_TEMP1 = PO INTERACT PMOS_OD // find PMOS
gate POLY
PMOS_POLY_TEMP2 = SHRINK PMOS_POLY_TEMP1 TOP BY
(PMOS_WIDTH/2) BOTTOM BY (PMOS_WIDTH/2) // eliminate
horizontal POLY connecting to PMOS gate POLY by shrinking
PMOS_POLY_TEMP3 = GROW PMOS_POLY_TEMP2 TOP BY
(PMOS_WIDTH/2) BOTTOM BY (PMOS_WIDTH/2) // restore vertical
PMOS gate POLY
```

In step 420, the PMOS gate poly is expanded upward by a predetermined amount to maintain proper extension over the expanded PMOS OD, and a script for step 420 is:

```
FINAL_PMOS_POLY = GROW PMOS_POLY_TEMP3 TOP BY
ADD_PMOS_WIDTH // expand top edge of the PMOS gate POLY by a
predetermined amount
```

The NMOS gate poly receives similar treatment. Step 430 is to find vertical NMOS gate poly 162 as shown in FIG. 1, and scripts for step 430 are:

```
NMOS_POLY_TEMP1 = PO INTERACT NMOS_OD // find
NMOS gate POLY
NMOS_POLY_TEMP2 = SHRINK NMOS_POLY_TEMP1
TOP BY (NMOS_WIDTH/2) BOTTOM BY (NMOS_WIDTH/2)
// eliminate horizontal POLY connecting to NMOS gate POLY
NMOS_POLY_TEMP3 = GROW NMOS_POLY_TEMP2 TOP
BY (NMOS_WIDTH/2) BOTTOM BY (NMOS_WIDTH/2) // restore
vertical NMOS gate POLY
```

In step 440, the NMOS gate poly is expanded downward by a predetermined amount to maintain proper extension over the expanded NMOS OD, and a script for step 440 is:

```
FINAL_NMOS_POLY = GROW NMOS_POLY_TEMP3 TOP
BY ADD_NMOS_WIDTH   // expand bottom edge of the NMOS
gate POLY by a predetermined amount
```

Figure 5:
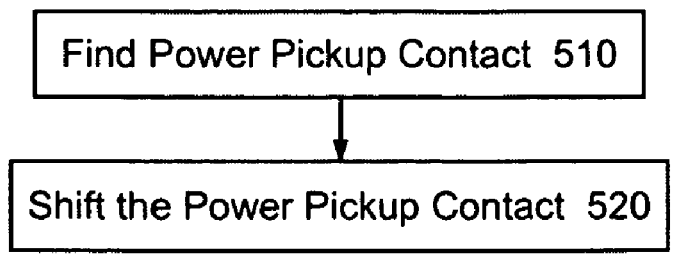
FIG. 5 is a flow chart illustrating layout adjustment steps for the contact (CO) layer.

FIG. 5 is a flow chart illustrating layout adjustment steps for the contact (CO) layer, or step 230 shown in FIG. 2. Referring to FIG. 1, only contacts to the power ODs 135 and 185 need to be moved to follow the adjustment of the power ODs 130 and 180, and contacts to the transistor source/drain or gate are not affected by the layout adjustment according to the embodiment of the present invention.

Referring to FIG. 5, step 510 is to find power pickup contacts (OD) 135 and 185 as shown in FIG. 1, and scripts for step 510 are:

```
POWER_VDD_CO_TEMP1 = CO AND VDD_OD_TEMP1 // find
original pick-up contact on "VDD"
POWER_VSS_CO_TEMP1 = CO AND VSS_OD_TEMP1 // find
original pick-up contact on "VSS"
```

In step 520, the power pickup COs are shifted to new locations to make contacts with the shifted ODs, and scripts for step 520 are:

```
FINAL_POWER_VDD_CO =
   SHIFT POWER_VDD_CO_TEMP1 BY 0
ADD_PMOS_WIDTH //shift Vdd CO to new locations
FINAL_POWER_VSS_CO =
   SHIFT POWER_VSS_CO_TEMP1 BY 0 (-
ADD_NMOS_WIDTH) //shift Vss CO to new locations
```

Figure 6:
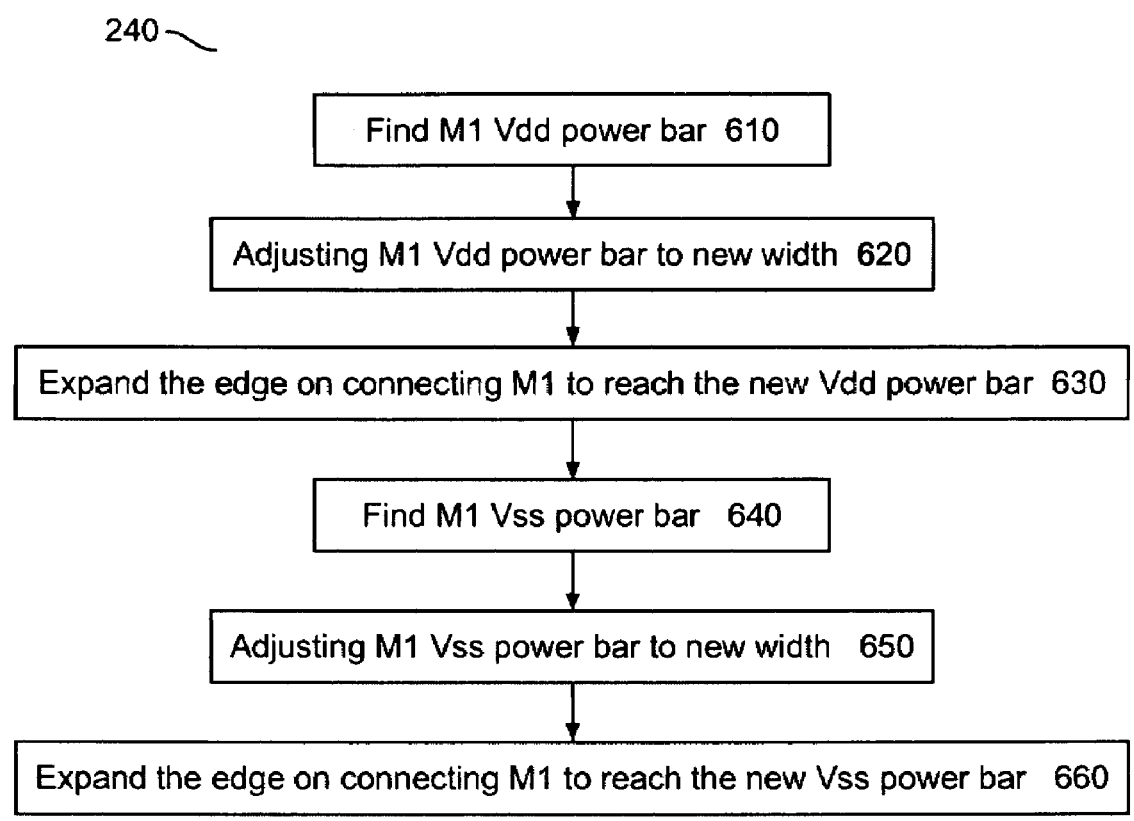
FIG. 6 is a flow chart illustrating layout adjustment steps for the metal1 (M1) layer.

FIG. 6 is a flow chart illustrating layout adjustment steps for the metal1 (M1) layer, or step 240 shown in FIG. 2. There are two kinds of M1. One is horizontal M1 lines dedicated to Vdd and Vss with a known width, POWER_WIDTH, and they are called Vdd power-bar and Vss power bar. The other is vertical M1 lines connecting Vdd or Vss power bars to terminals of transistors, and they are called connecting M1. These two kinds of M1 lines are physically one piece of M1, naming them differently is for the convenience of logic operation. Vdd power-bars need to be shifted and the connecting M1 needs to be expanded to touch the shifted Vdd power-bars in a combined stretching adjustment.

Referring to FIG. 6, step 610 is to find a Vdd power bar, and scripts for step 610 are:

```
POWER_M1_TEMP = ANGLE (M1 OUTSIDE EDGE
PRBNDRY) ==0 // find horizontal M1 outer edge
POWER_M1_VDD = (EXPAND EDGE POWER_M1_TEMP
INSIDE BY POWER_WIDTH ) WITH TEXT "VDD" // find connecting
M1 by shrinking off original M1 Vdd power bar
POWER_M1_VDD_BAR = (M1 WITH TEXT "VDD") NOT
POWER_M1_VDD
//find M1 Vdd power bar
```

Step 620 is to adjust the M1 Vdd power bar to a predetermined new width, and a script for step 620 is:

```
FINAL_VDD_POWER_BAR = GROW (SHRINK
(GROW POWER_M1_VDD TOP BY ADD_PMOS_WIDTH)
BOTTOM BY ADD_PMOS_WIDTH) TOP BY
((NEW_POWER_WIDTH - POWER_WIDTH)/2) BOTTOM BY
((NEW_POWER_WIDTH - POWER_WIDTH)/2) // Adjusting M1
Vdd power bar to a predetermined new width
```

The connecting M1 lines are expanded to touch the new Vdd power bar in step 630, and scripts for step 630 are:

```
EDGE_POWER_VDD = POWER_M1_VDD COINCIDENT
EDGE POWER_M1_VDD_BAR // find M1 edge between Vdd power
bar and M1 connecting to it
FINAL_VDD_CONNECTING_M1 = EXPAND EDGE
EDGE_POWER_VDD OUTSIDE BY ADD_PMOS_WIDTH // expand
the edge on connecting M1 to touch the new Vdd power bar
```

Similar logic operations are also applied to M1 Vss powerbar. Step 6 is to find the Vdd power bar, and scripts for step 610 are:

```
POWER_M1_VSS = (EXPAND EDGE POWER_M1_TEMP
INSIDE BY POWER_WIDTH) WITH TEXT "VSS" // find connecting
M1 by shrinking off original M1 Vss power bar
    POWER_M1_VSS_BAR = (M1 WITH TEXT "VSS") NOT
POWER_M1_VSS
// find M1 Vss power bar
```

Step 650 is to adjust the M1 Vss power bar to a predetermined new width, and a script for step 650 is:

```
FINAL_VSS_POWER_BAR = GROW (SHRINK (GROW
POWER_M1_VSS BOTTOM BY ADD_NMOS_WIDTH) TOP
BY ADD_NMOS_WIDTH) TOP BY ((NEW_POWER_WIDTH –
POWER_WIDTH)/2) BOTTOM BY ((NEW_POWER_WIDTH –
POWER_WIDTH)/2) // Adjusting M1 Vss power bar to the
predetermined new width
```

The connecting M1 lines are expanded to touch the new Vss power bar in step 660, and scripts for step 660 are:

```
EDGE_POWER_VSS = POWER_M1_VSS COINCIDENT EDGE
POWER_M1_VSS_BAR // find M1 edge between Vss power bar
and connecting M1
    FINAL_VSS_CONNECTING_M1 = EXPAND EDGE
EDGE_POWER_VSS OUTSIDE BY ADD_NMOS_WIDTH // Expand
the edge on connecting M1 to touch the new Vss power bar
```

Total M1 patterns are a summation of all the power bars and connecting M1:

```
FINAL_M1 = FINAL_VDD_POWER_BAR OR
FINAL_VDD_CONNECTING_M1 OR FINAL_VSS_POWER_BAR
OR FINAL_VSS_CONNECTING_M1
```

FIG. 7 details the layout adjustment on the Nwell (NW) layer, or step 250 shown in FIG. 2. Since the NW pattern is a rectangular area covering the entire PMOS region, its layout adjustment as shown in step 710 of FIG. 7 is simply to grow the upper edge of the NW by the predetermined amount PMOS OD receives. A script for step 710 is:

```
FINAL_NW=GROW NW TOP BY ADD_PMOS_
    WIDTH
```

FIG. 8 details layout adjustment on the boundary (PRBNDRY) layer, or step 260 shown in FIG. 2. Since the PRBNDRY pattern is a rectangular area covering the entire CMOS region between PMOS OD and NMOS OD, its layout adjustment as shown in step 810 of FIG. 8, is simply to grow the upper edge of the PRBNDRY upward by the predetermined amount the PMOS OD receives, and to grow the lower edge of the PRBNDRY downward by the predetermined amount NMOS OD receives. A script for step 810 is:

```
FINAL_PRBNDRY=GROW PRBNDRY TOP BY
    ADD_PMOS_WIDTH BOTTOM BY ADD_N-
    MOS_WIDTH
```

FIG. 9 is a flow chart illustrating detailed layout adjustments on the P+ implant (PP) layer, or step 270 shown in FIG. 2. PP in PMOS region is for PMOS transistor source/drain implant, in NMOS region is for Vss power OD implant. Step 910 is to grow PP upper edge upward for PMOS transistor OD, and scripts for step 910 are:

```
NW_PP_TEMP1 = PP AND NW // find PP inside NW
NW_PP_TEMP2 =
NW_PP_TEMP1 INTERACT PMOS_OD // find PP for
PMOS OD
    FINAL_NW_PP =
(GROW NW_PP_TEMP2 TOP BY ADD_PMOS_WIDTH)
// grow PP upper edge upward for PMOS OD
```

Step 920 is to shift PP for Vss power OD to the new location where the final Vss power OD is shifted to. Scripts for step 920 are:

```
PS_PP_TEMP1 = PP NOT NW // find PP in NMOS region
PS_PP_TEMP2 = PS_PP_TEMP1 INTERACT
VSS_OD_TEMP1 // find PP for Vss power OD
    FINAL_PS_PP = SHIFT (PS_PP_TEMP2) BY 0
(-ADD_NMOS_WIDTH) // shift PP for Vss power OD to a new
location.
```

Total PP pattern is a sum of PP for PMOS OD and PP for Vss power OD:

FINAL_PP=FINAL_NW_PP OR FINAL_PS_PP

FIG. 10 is a flow chart illustrating detailed layout adjustments on N+ implant (NP) layer, or step 280 shown in FIG. 2. NP in a PMOS region is for Vdd power OD implant, in an NMOS region is for the NMOS transistor source/drain implant. Step 1010 is to shift NP for Vdd power OD to the new location where the final Vdd power OD is shifted to, and scripts for step 910 are:

```
NW_NP_TEMP1 = NP AND NW // find NP inside NW
    NW_NP_TEMP2 = NW_NP_TEMP1 INTERACT
VDD_OD_TEMP1 // find NP for Vdd power OD
    FINAL_NW_NP = SHIFT (NW_NP_TEMP2) BY 0
(ADD_PMOS_WIDTH) // shift NP for Vdd power OD
to a new location.
```

Step 1020 is to grow the NP lower edge downward for NMOS transistor OD, and scripts for step 1020 are:

```
PS_NP_TEMP1 = NP NOT NW // find NP in NMOS region
PS_NP_TEMP2 =
PS_NP_TEMP1 INTERACT NMOS_OD // find NP for NMOS OD
    FINAL_PS_NP = (GROW PS_NP_TEMP2 BOTTOM BY
ADD_NMOS_WIDTH) // grow NP lower edge downward for NMOS N+
```

The total NP pattern is a sum of NP for Vdd power OD and NP for NMOS OD:

FINAL_NP=FINAL_NW_NP OR FINAL_PS_NP

The foregoing description and drawings merely explain and illustrate the invention. The invention is not limited thereto except insofar as the appended claims are so limited, as those skilled in the art that have the disclosure before them will be able to make modifications and variations therein without departing from the scope of the invention.

The appended claims are not to be interpreted as including means-plus-function limitations, unless such a limitation is explicitly recited in a given claim using the phrase(s) "means for" and/or "step for." Sub-generic embodiments of the invention are delineated by the appended independent claims and their equivalents. Specific embodiments of the invention are differentiated by the appended dependent claims and their equivalents.

What is claimed is:

1. A method for automatically adjusting a layout of one type of metal-oxide-semiconductor (MOS) integrated circuit (IC) cells, the method comprising the following steps of Boolean logic operations on at least one such cell:

identifying one or more MOS transistor active areas (ODs) and one or more power ODs in an OD layer;

expanding the one or more MOS transistor ODs in a predetermined direction by a first predetermined amount;

shifting the one or more power ODs in the predetermined direction by a second predetermined amount;

expanding one or more MOS transistor gate areas in the predetermined direction by a third predetermined amount;

shifting one or more power OD contacts in the predetermined direction by the second predetermined amount; and stretching one or more metal areas (M1s) in a metal layer that is directly coupled to the OD layer through contacts electronically, in the predetermined direction by a predetermined new width, wherein a cell height and a transistor width of the MOS IC layout are automatically and independently adjusted.

2. The method of claim 1, wherein identifying further comprises intersecting (AND operation) the OD layer with one or more implant layers.

3. The method of claim 1, wherein expanding one or more MOS transistor gates further comprises distinguishing the MOS transistor gate areas from other layout areas by intersecting (AND operation) a MOS transistor gate layer with the MOS transistor ODs.

4. The method of claim 1, wherein stretching further comprises:

distinguishing one or more power M1s, which overlap the power OD, from connecting M1s, which connects the one or more power M1s to one or more MOS transistor terminals electronically;

growing the one or more power M1s in the first predetermined direction by a fourth predetermined amount;

shifting the one or more grown power M1s in the first predetermined direction by a fifth predetermined amount; and expanding the connecting M1 in the first predetermined direction by an amount derived from the fourth and fifth predetermined amounts, wherein the expanded connecting M1s touches the grown power M1s.

5. The method of claim 1 further comprising expanding one or more boundary areas in at least one boundary layer in the predetermined direction by a sixth predetermined amount.

6. The method of claim 1 further comprising expanding one or more implant areas in at least one implant layer in the predetermined direction by a seventh predetermined amount.

* * * * *